United States Patent
Fiedler

(10) Patent No.: US 6,757,327 B1
(45) Date of Patent: Jun. 29, 2004

(54) SERIAL DATA COMMUNICATION RECEIVER HAVING ADAPTIVE TERMINATION RESISTORS

(75) Inventor: Alan S. Fiedler, Bloomington, MN (US)

(73) Assignee: LSI Logic Corporation, Milpitas, CA (US)

( * ) Notice: Subject to any disclaimer, the term of this patent is extended or adjusted under 35 U.S.C. 154(b) by 791 days.

(21) Appl. No.: 09/676,909

(22) Filed: Oct. 2, 2000

(51) Int. Cl.[7] .......................... H03H 7/30; H03K 5/159
(52) U.S. Cl. .................. 375/232; 375/257; 375/348; 375/350
(58) Field of Search ........................ 375/229, 232, 375/236, 257, 346, 348, 350, 376; 708/322, 323; 333/18, 28 R; 713/400

(56) References Cited

U.S. PATENT DOCUMENTS

| | | | |
|---|---|---|---|
| 5,633,899 A | 5/1997 | Fielder et al. ............... | 375/376 |
| 5,757,865 A | * 5/1998 | Kaku et al. .................. | 375/344 |
| 6,320,834 B1 | * 11/2001 | Tsuchinaga .............. | 369/59.21 |
| 6,643,787 B1 | * 11/2003 | Zerbe et al. ................ | 713/400 |

OTHER PUBLICATIONS

"Rate–Independent" CDR Chip Locks In At Up To 2.7 Gbits/s,*Electronic Design*, (Mar. 20, 2000) http://www.el-ecdesign.com/magazine/2000/mar2000/coverstory/cov1.shtml?ads=communication.

* cited by examiner

*Primary Examiner*—Don N. Vo
(74) *Attorney, Agent, or Firm*—Westman, Champlin & Kelly

(57) ABSTRACT

A serial data communication receiver includes a serial data input and a termination resistance, which is coupled to the serial data input and is variable over a range of termination resistance values. An equalizer circuit is coupled to the serial data input and has an equalized serial data output. First and second capture latch circuits are coupled to the equalized serial data output, within a phase-locked loop, and have first and second recovered data outputs, respectively. A termination resistance control circuit measures a data eye size of the equalized serial data output based on the first and second recovered data outputs over the range of termination resistance values and sets the termination resistance to one of the termination resistance values based on the measured data eye sizes.

13 Claims, 5 Drawing Sheets

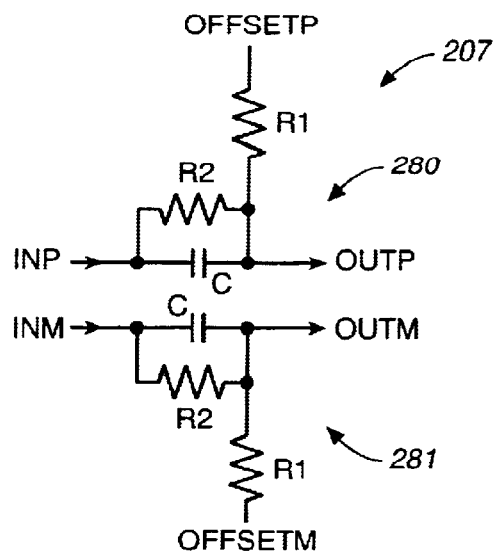
FIG._2A
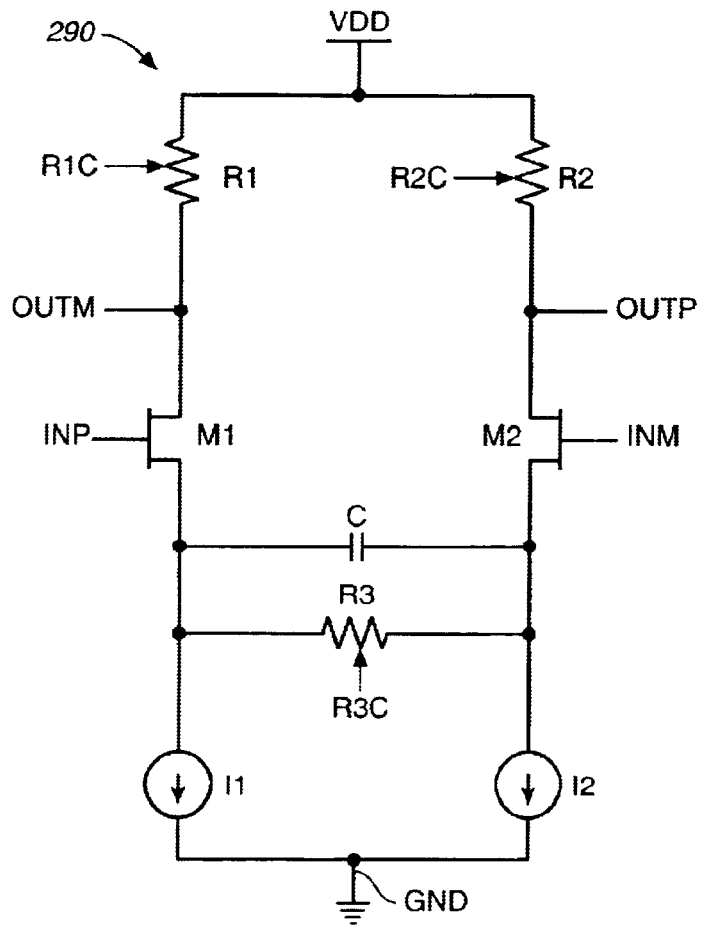
FIG._2B

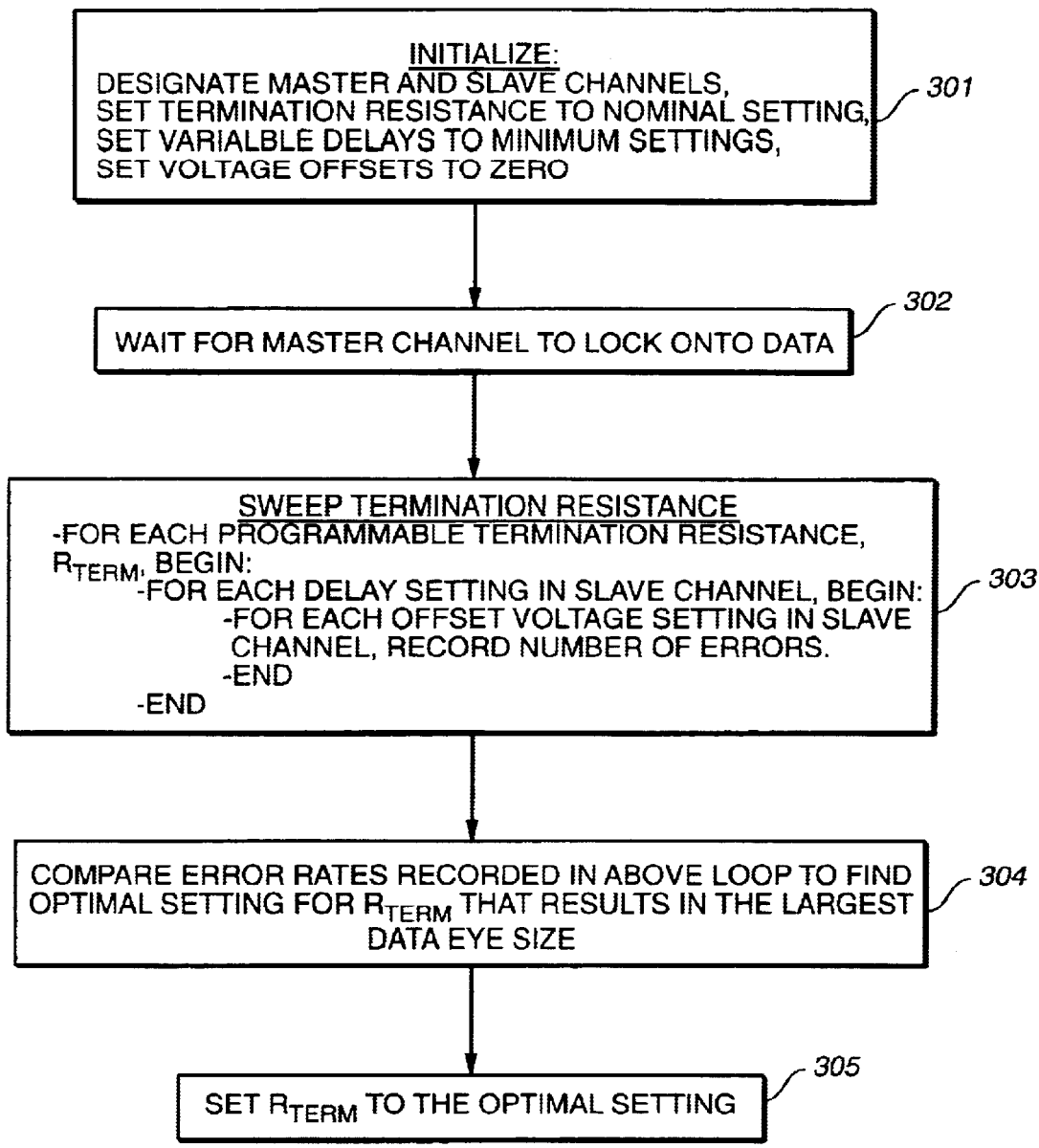
FIG._3

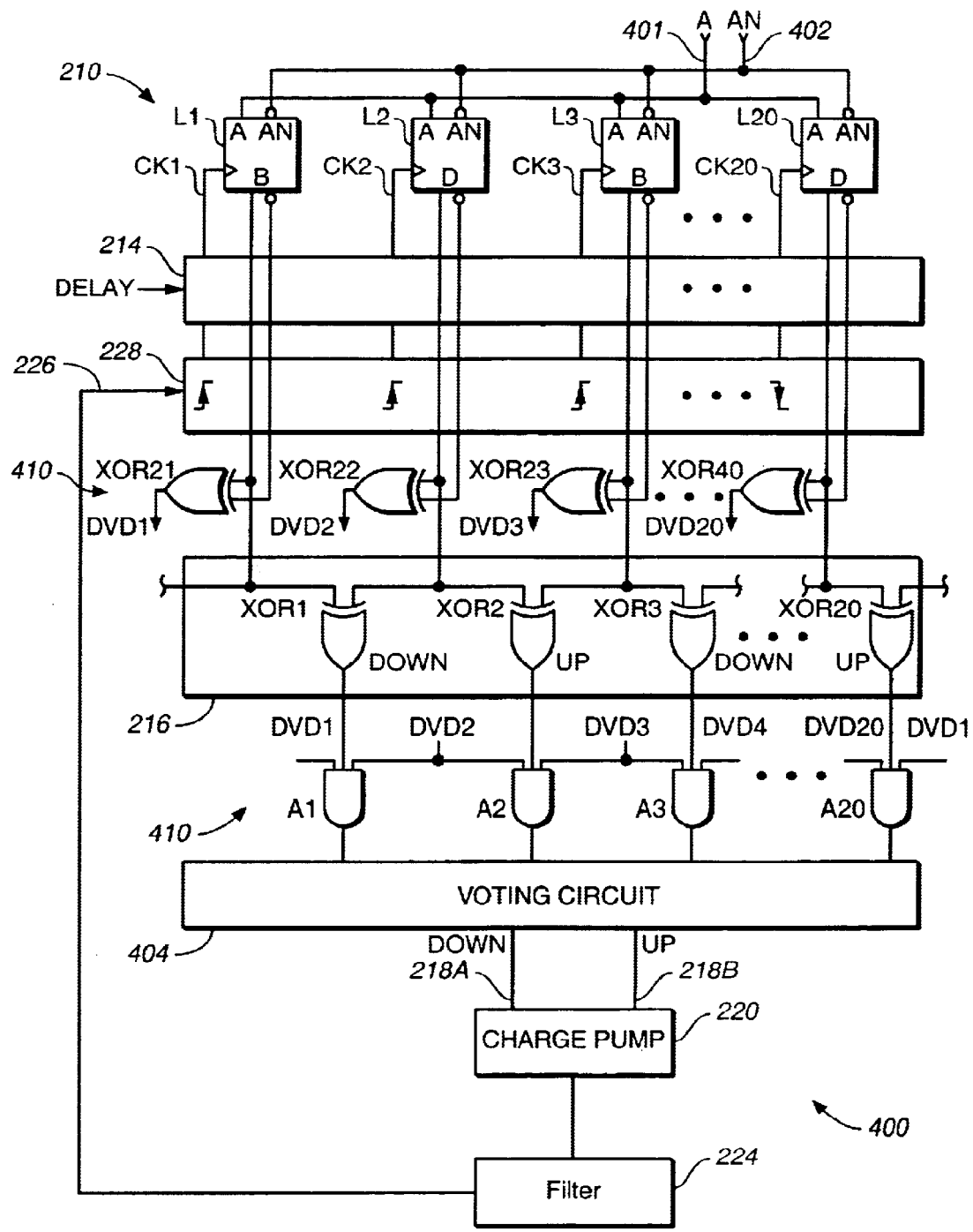
FIG._4

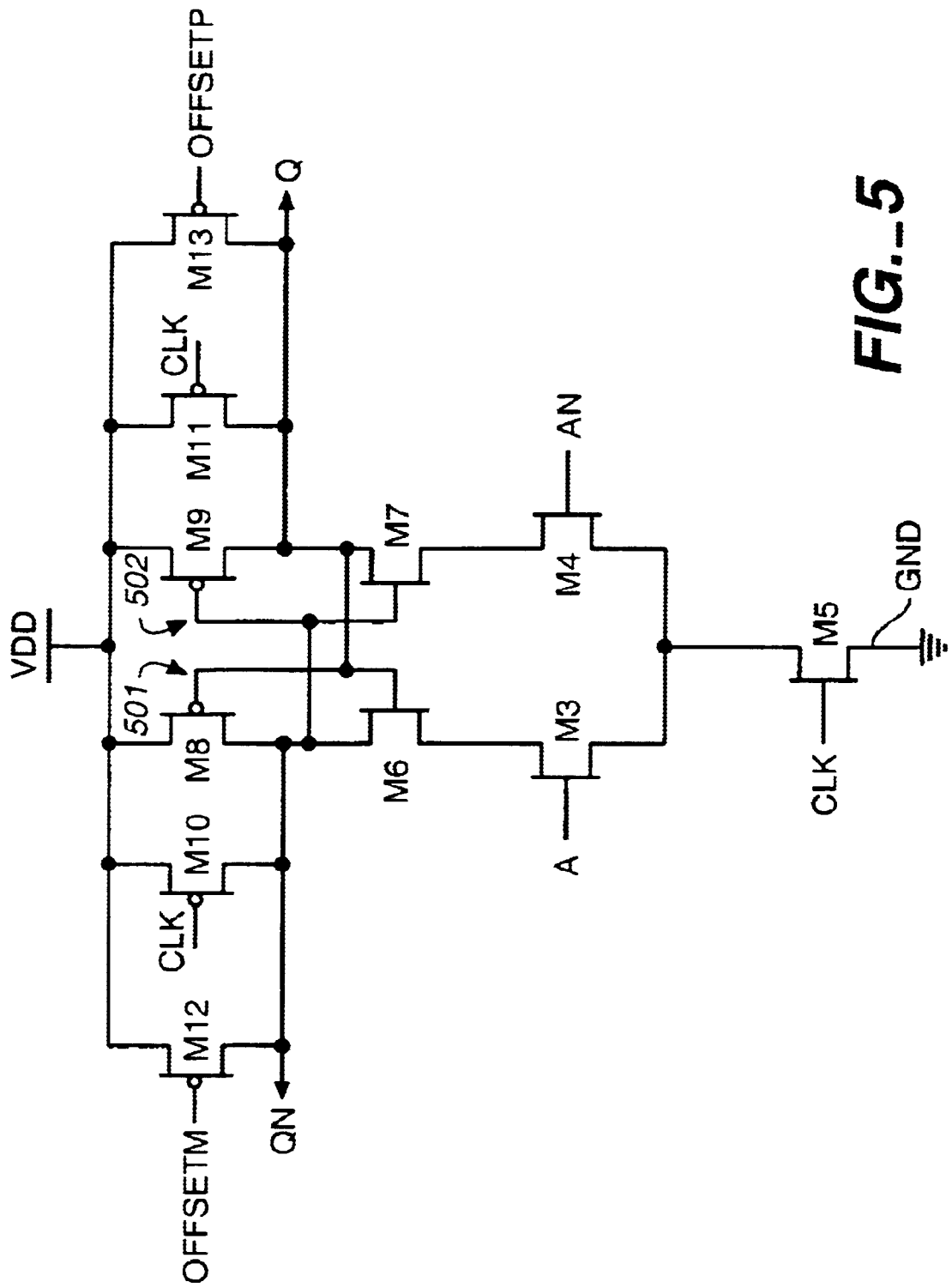
FIG._5

SERIAL DATA COMMUNICATION RECEIVER HAVING ADAPTIVE TERMINATION RESISTORS

CROSS-REFERENCE TO RELATED APPLICATIONS

Cross reference is made to U.S. Ser. No. 09/677,269, entitled "SERIAL DATA COMMUNICATION RECEIVER HAVING ADAPTIVE EQUALIZATION" and to U.S. Ser. No. 09/677,350, entitled "SERIAL DATA COMMUNICATION RECEIVER HAVING ADAPATIVELY MINIMIZED CAPTURE LATCH OFFSET VOLTAGE," filed on even date herewith.

BACKGROUND OF THE INVENTION

The present invention relates to serial data communication receivers for data capture and clock recovery and, more particularly, to a receiver and method for terminating a serial data signal.

Serial communication receivers are used in integrated circuits, such as application specific integrated circuits (ASICs), for clock synchronization and for recovery of serial data streams from transmission channels. Clock signals and data are recovered by detecting transitions in the serial data stream and the valid data between those transitions. The time and voltage ranges over which the data is valid within each cycle in the stream is known as the data "eye". In order to minimize bit errors in the recovered data, the serial data stream is preferably sampled near the center of this eye. However, the limited-bandwidth nature of a transmission channel results in distortion and closure of the data eye in both the time and voltage domains.

One current method of limiting distortion and closure of the data eye at the receiver is to provide equalization of the incoming data signal through a high-pass filter, or equalizer, which is located either on-board or on-chip. The equalizer boosts the voltage sensitivity of the receiver at those frequencies at which attenuation of the incoming data signal due to the frequency response of the transmit media rolls off. The net effect is an extension in the flat region of the frequency response of the combination of the transmitter, the transmit media and the receiver.

In addition, one or typically both ends of the transmission line are resistively terminated to a reference voltage such as a power supply terminal or a ground terminal. The total effective termination resistance is matched to the impedance of the transmission line to minimize reflection and distortion of the transmitted data signals. However, the impedance of the transmission line can vary with each application. Therefore, the fixed termination resistance in the receiver may not be optimal for a particular application.

A serial data communication receiver is desired that is capable of evaluating the performance of a complete transceiver system, which includes the transmit media, and adjusting the termination resistance in the receiver to compensate for this performance and essentially open the eye of the incoming data stream.

SUMMARY OF THE INVENTION

One aspect of the -present invention is directed to a method of adaptively terminating a received serial data signal. The method includes terminating the received serial data signal with a variable termination resistance. The received serial data signal is equalized with an equalizer to produce an equalized serial data signal. The equalized serial data signal is then de-serialized. The termination resistance is varied over a range of termination resistance values while equalizing and de-serializing. A data eye size of the equalized serial data signal is measured for each of the termination resistance values, and the termination resistance is set to one of the termination resistance values based on the measured data eye sizes.

Another aspect of the present invention relates to a serial data communication receiver, which includes a serial data input and a termination resistance that is coupled to the serial data input and is variable over a range of termination resistance values. An equalizer circuit is coupled to the serial data input and has an equalized serial data output. First and second capture latch circuits are coupled to the equalized serial data output, within a phase-locked loop, and have first and second recovered data outputs, respectively. A termination resistance control circuit measures a data eye size of the equalized serial data output based on the first and second recovered data outputs over the range of termination resistance values and sets the termination resistance to one of the termination resistance values based on the measured data eye sizes.

Yet another aspect of the present invention relates to a serial data communication receiver, which includes a serial data input and a termination resistance that is coupled to the serial data input and is variable over a range of termination resistance values. First and second equalizers are coupled to the serial data input and have first and second equalized outputs. The first equalizer applies a voltage offset to the first equalized output, which is variable based on a voltage offset control input. First and second capture latch circuits are coupled to the first and second equalized outputs, respectively, in a phase-locked loop and have first and second recovered data outputs, respectively. The first capture latch circuit has a variable sample time relative to the second capture latch circuit based on a delay control input. A comparator is coupled to the first and second recovered data outputs through first and second comparator inputs, respectively, and has an error output. A termination resistance control circuit is coupled in a feedback loop between the error output and the termination resistance control input to control the voltage offset and delay control inputs and adjust the termination resistance based a resulting error on the error output.

BRIEF DESCRIPTION OF THE DRAWINGS

FIG. 2A is a schematic diagram of an equalizer used in the receiver shown in FIG. 1, which is capable of inducing a variable offset voltage.

FIG. 2B is a schematic diagram of an equalizer which is capable of inducing a variable offset voltage according to an alternative embodiment of the present invention.

FIG. 3 is a flowchart illustrating an example of an optimization sequence for adaptively terminating a serial data stream according to one embodiment of the present invention.

FIG. 4 is block diagram illustrating in greater detail a phase-locked loop that is used in the receiver show in FIG. 1 according to one embodiment of the present invention.

FIG. 5 is a schematic diagram illustrating a single capture latch having offset control.

DETAILED DESCRIPTION OF ILLUSTRATIVE EMBODIMENTS

Figure 1:
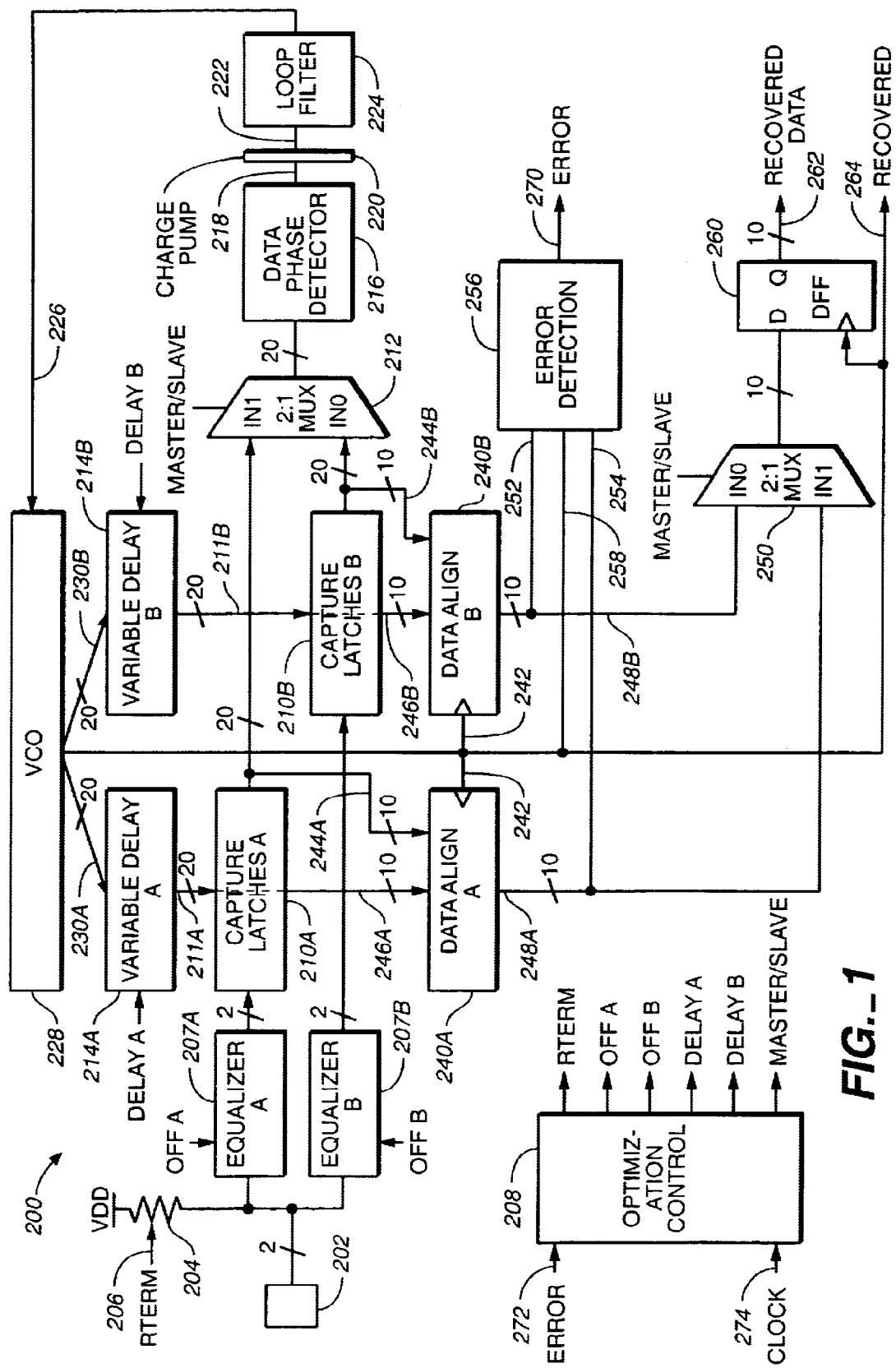
FIG. 1 is a block diagram of a serial data communication receiver having an adaptive termination resistance according to one embodiment of the present invention.

FIG. 1 is a block diagram of a serial data communication receiver 200 according to one embodiment of the present invention. Receiver 200 is adapted to recover clock signals and data from an incoming serial data stream. In addition, receiver 200 is capable of optimizing the termination resistance applied to the serial data stream so that the stream has the largest possible data eye size in the time and voltage domains.

The particular type of receiver shown in FIG. 1 is provided as an example only. Virtually any type of clock recovery and de-serializer circuit can be used with the present invention. For example, one suitable circuit on which the clock recovery and de-serializer functions of the embodiment shown in FIG. 1 are based is disclosed in Fiedler et al. U.S. Pat. No. 5,633,899, which is entitled "PHASE LOCKED LOOP FOR HIGH SPEED DATA CAPTURE OF A SERIAL DATA STREAM" and issued on May 27, 1997. Other examples of suitable circuits include the circuits that implement transceiver standards, such as the Fiber Channel and Gigabit Ethernet standards. Examples of these circuits are manufactured by companies such as Applied Microcircuits Corporation, Vitesse Semiconductor Corp., Motorola, Inc., Texas Instruments, Inc., International Business Machines Corporation, and LSI Logic Corporation. Other clock recovery and de-serializer circuits can also be used.

Referring to FIG. 1, receiver 200 includes a differential serial data input 202. Two variable termination resistors 204 are coupled between differential input 202 and voltage bias terminal VDD. Resistors 204 each have a resistance control input 206, labeled $R_{TERM}$, which is coupled to optimization control circuit 208. Resistors 204 can include a single, continuously variable resistor or can include an array of switchable resistors, with each resistor having a different resistance value.

Equalizers 207A and 207B are coupled in series between input 202 and capture latch array circuits 210A and 210B, respectively. Equalizers 207A and 207B have adjustable input offset voltages, as described in more detail with reference to FIGS. 2A and 2B. These offset voltages are adjusted through offset control inputs OFFA and OFFB for equalizers 207A and 207B, respectively, so that the size of the data "eye" of the incoming data stream can be probed in the voltage domain. Control inputs OFFA and OFFB are coupled to optimization control circuit 208.

Capture latch arrays 210A and 210B are coupled in series between equalizers 207A and 207B and inputs IN1 and IN0, respectively, of master/slave multiplexer 212. Equalizer 207A and capture latch array 210A form a first receiver channel "A", and equalizer 207B and capture latch array 210B form a second receiver channel "B". As described in more detail below with reference to FIG. 4, each capture latch array 210A and 210B includes a plurality of data capture latches and a plurality of boundary capture latches for sampling the incoming serial data stream to recover data and clock signals from the stream. The capture latches in arrays 210A and 210B are clocked by respective clock signals 211A and 211B provided through variable delay circuits 214A and 214B. In one embodiment, each capture latch array 210A and 210B includes 10 data capture latches, 10 boundary capture latches, and 20 respective capture latch clock signals. However, any number of latches can be used in alternative embodiments.

The outputs of the data and boundary capture latches are supplied to the respective inputs of multiplexer 212. Multiplexer 212 has a select input labeled. MASTER/SLAVE, which is provided by optimization control circuit 208. The output of multiplexer 212 is coupled to the input of data phase detector 216. Based on the state of the MASTER/SLAVE select input, multiplexer 212 determines which of the channels "A" or "B" will be the master channel, and which will be the slave channel. A channel is designated as the master channel when its capture latch outputs control the phase of the sample clock inputs 211A and 211B through data phase detector 216, charge pump 220, loop filter 224 and voltage-controlled oscillator 228. A channel is designated as the slave channel when its capture latch outputs are disconnected from these control-loop elements. The designation and function of a channel as either master or slave is therefore digitally controllable by optimization control circuit 208 through the MASTER/SLAVE select signal. As described in more detail below, the slave channel is used for making various performance adjustments to determine the termination resistor setting that results in the optimum data eye size of the incoming serial data stream as seen by capture latches 210A and 210B.

The output of multiplexer 212, which includes the data and boundary capture latch outputs of the selected, "master" channel, are provided to the inputs of data phase detector 216. Based on these outputs, data phase detector 216 generates phase correction signals on output 218, which are representative of a difference between a transition of the incoming data stream and a phase of the sample clock signals 211A or 211B provided through variable delay circuits 214A and 214B. These phase correction signals cause charge pump 220 to pump charge onto or off of loop filter 224. The output of loop filter 224 is coupled to control input 226 of VCO 228 for changing the phase and frequency of VCO 228 as a function of the voltage on loop filter 224.

In one embodiment, VCO 228 has multiple stages or phases for generating a plurality of sample clock signals on outputs 230A and 230B. Each sample clock signal is delayed from the previous clock signal by an adjustable delay, which is based on the voltage applied to voltage control input 226 of VCO 228. These sample clock signals are provided to capture latch arrays 210A and 210B through variable delay circuits 214A and 214B. By using multiple capture latch elements and multiple phases of the sample clock, the incoming high-speed serial data stream can be sampled with VCO 228 oscillating at only a fraction of the data bit rate.

Variable delay elements 214A and 214B have control inputs DELAYA and DELAYB, which are provided by optimization control circuit 208. Variable delay circuits 214A and 214B allow the sample times of the capture latches in one of the capture latch arrays 210A and 210B to be varied relative to the sample times of the other of the capture latch arrays 210A and 210B so that the size of the data eye at the inputs of arrays 210A and 210B can be probed in the time domain. During normal operation, the delay through variable delay elements 214A and 214B are set to a fixed (and usually minimum) delay.

Capture latch arrays 210A and 210B, data phase detector 216, charge pump 220, loop filter 224 and VCO 228 together operate as a phase-locked loop, which adjusts the phase and frequency of VCO 228 to match the phase and frequency of the transitions in the incoming data stream. When VCO 228 has locked onto the incoming data stream, one of the sample clock signals generated by VCO 228 can be used as a recovered clock signal that is provided to recovered clock output 264. This clock signal can also be used to align the data recovered by capture latch arrays 210A and 210B to a single clock signal.

Data alignment is performed by data alignment circuits 240A and 240B. The outputs of the data capture latches in capture latch arrays 210A and 210B are coupled to data inputs 244A and 244B, respectively, of data alignment circuits 240A and 240B. The recovered clock signals are provided to clock inputs 246A and 246B of data alignment circuits 240A and 240B for registering the valid data from each capture latch to a single clock edge. Data alignment circuits 240A and 240B have parallel data outputs 248A and 248B, which are coupled to inputs IN1 and IN0, respectively, of multiplexer 250 and to comparison inputs 252 and 254, respectively, of error detection comparator 256.

Multiplexer 250 includes a select input labeled MASTER/SLAVE, which is provided by optimization control circuit 208. Similar to multiplexer 212, multiplexer 250 is controlled to select data from the channel that is currently designated as the "master" channel. This data is provided to the data input of flip-flop circuit 260, which is clocked by the recovered clock signal from VCO 228. The output of flip-flop circuit 260 is coupled to recovered data output 262.

Error detection comparator 256 detects differences between the data recovered by the slave channel and the data recovered by the master channel. Clock input 258 is used to synchronize the comparison to the time at which the comparison inputs 252 and 254 are valid. Comparison output 270 represents the resulting difference or error, and is coupled to error input 272 of optimization control circuit 208.

As discussed in more detail below with reference to FIG. 3, optimization control circuit 208 executes an optimization sequence to find the termination resistance that results in the largest possible opening in the data eye seen by capture latch arrays 210A and 210B in the time and voltage domains. This optimization sequence measures the data eye by sweeping the offset voltage applied by the slave equalizer and the variable delay in the clock signals applied to the slave capture latches. The optimization sequence can be implemented by a programmed computer or can be reduced to a state machine, for example. Individual components of optimization control circuit 208 or functions performed by circuit 208 can be implemented in hardware, software or a combination of both. The timing of the optimization sequence is controlled by clock input 274.

FIG. 2A is a schematic diagram illustrating an example of a programmable, passive equalizer having an adjustable offset voltage according to one embodiment of the present invention. Equalizer 207 (either 207A or 207B in FIG. 1) includes two single-ended passive equalizers 280 and 281, input terminals INP and INM, output terminals OUTP and OUTM and voltage offset terminals OFFSETP and OFFSETM. Equalizers 280 and 281 include resistors R1 and R2. A capacitor C is coupled in series between a respective input terminal INP and INM and a respective output terminal OUTP and OUTM. A resistors R2 is coupled in parallel with each of a respective one of the capacitors C. A resistor R1 is coupled between each of a respective output terminal OUTP and OUTM and a respective voltage offset terminal OFFSETP and OFFSETM.

An offset voltage between outputs OUTP and OUTM can be induced by applying different voltages to voltage offset terminals OFFSETP and OFFSETM. In an alternative embodiment, an offset voltage between outputs OUTP and OUTM can be induced by independently adjusting all four resistors (resistors R1 and R2 in single-ended equalizer 280 and resistors R1 and R2 in single-ended equalizer 281) to obtain the desired offset voltage. Voltage offset terminals OFFSETP and OFFSETM are collectively referred to as offset control inputs "OFFA" and "OFFB" in FIG. 1.

FIG. 2B is a schematic diagram illustrating an active equalizer with offset control, according to yet another alternative embodiment of the present invention. Equalizer 290 includes inputs INP and INM, outputs OUTP and OUTM, resistors R1, R2 and R3, differential transistor pair M1 and M2, capacitor C and current sources I1 and I2. Inputs INP and INM are coupled to the gates of transistors M1 and M2, respectively. Outputs OUTM and OUTP are coupled to the drains of transistors M1 and M2, respectively. Resistors R1 and R2 are coupled in series between the drains of transistors M1 and M2, respectively, and voltage supply terminal VDD. Capacitor C and resistor R3 are coupled in parallel with one another, between the sources of transistors M1 and M2. Current sources I1 and I2 are coupled in series between the sources of transistors M1 and M2, respectively, and voltage supply terminal GND.

An offset voltage between inputs INP and INM can be induced by setting the current level supplied by current source I1 different than the current level supplied by current source I2. If the current level supplied by current source I1 is less than that supplied by current source I2, a positive input offset voltage results. If the current level supplied by current source I1 is greater than that supplied by current source I2, a negative input offset voltage results. Alternatively, the resistances of resistors R1 and R2 can be adjusted independently so as to allow for the inducement of an offset voltage in equalizer 290, at inputs INP and INM.

FIG. 3 is a flowchart illustrating an example of an optimization sequence for adaptively setting the termination resistance $R_{TERM}$ according to one embodiment of the present invention. At step 301, optimization control circuit 208 designates one channel to operate as the master channel and the other channel to operate as the slave channel. Optimization control circuit 208 then initializes the termination resistance to a nominal setting, the variable delays to minimum delay values and the voltage offset (OFFSETP-OFFSETM) to zero.

At step 302, optimization control circuit 208 waits for the master channel to lock onto the incoming serial data stream. Once the master channel has locked onto the data stream, optimization control circuit 208 adjusts the slave channel offset voltage in equalizer 207 (207A or 207B, depending on which channel is the slave) and delay in variable delay 214 (again, either 214A or 214B) to probe the size of the data eye in the voltage and time domains for each termination resistance setting, at step 303.

For each different termination resistance value, optimization control circuit 208 sweeps the slave channel variable delay over a range of delay values. For each slave channel delay setting, optimization control circuit 208 sweeps the offset voltage induced by the slave channel equalizer over a range of offset settings while monitoring the error rate at error output 270.

As the magnitude of the variable delay and/or the magnitude of the voltage offset applied to the slave channel increases, the recovered data from the slave capture latches begins to differ from the recovered data from the master capture latches. The rate at which these differences occur at each delay and voltage offset setting is stored by optimization control circuit 208 in a register or other computer readable memory. The stored error rates, in total, reflect the size of the data eye in the time and voltage domains for the present termination resistance settings. This process is repeated for other termination resistance settings.

At step 304, optimization control circuit 208 compares the error rates recorded in step 303 to find the optimal termination resistance that results in the largest data eye size in the voltage domain and in the time domain.

At step 305, optimization control circuit 208 sets the termination resistance to the optimum resistance determined in step 304. The master channel is now ready to receive data with a termination resistance giving the largest possible data eye size.

The optimization sequence shown in FIG. 3 allows the termination resistance to be optimized for any application. The offset voltage and variable delay in the slave channel are used for scanning the size of the data eye for each termination resistance setting.

Since the transmit media impedance can vary with each application, the serial data communication receiver of the present invention evaluates the performance of the transmit media and adjusts the termination resistance of the receiver to compensate for variations in the transmit media performance and essentially open the "eye" of the incoming data to reduce bit errors. Termination resistance performance is therefor optimized automatically for any application.

In an alternative embodiment, where the data eye size is probed in the time domain but not in the voltage domain, the receiver can include only one equalizer. The equalized output of the equalizer is coupled to the inputs of both capture latch arrays. Other variations can also be made.

As mentioned above, the adaptive termination resistance and optimization routine of the present invention can be used with virtually any type of serial communications receiver. The receiver would simply be modified to include the adaptive termination resistance, two separate channels, the variable channel delay and the corresponding control circuitry shown in FIG. 1. FIG. 4 is a block diagram which illustrates in greater detail one possible phase-locked loop 400 that can be used in the receiver shown in FIG. 1. For simplicity, only one channel is shown with multiplexer 212 also being eliminated from the drawing. The same reference numerals are used in FIG. 4 as were used in FIG. 1 for the same or similar components.

Phase-locked loop 400 includes a multiple-bit capture latch array 210 (either 210A or 210B in FIG. 1) for sampling the equalized serial data stream applied to differential inputs 401 and 402. Capture latch array 210 includes individual capture latch elements L1–L20 (L4–L19 not shown), which sample the data stream at different phases in response to sample clock signals CK1–CK20 (CK4–CK19 not shown) received from VCO 226 through variable delay circuit 214 (either 214A or 214B in FIG. 1). Each capture latch element samples either the data bit or the boundary between data bits (i.e., a transition). Capture latch elements L1–L20 are labeled "D" and "B" to indicate data capture latch elements and boundary capture latch elements, respectively.

A typical data stream is divided into groups of N bits of data. Capture latch array 210 includes 2*N capture latch elements for each of the N bits of data in the group. In the embodiment shown in FIG. 4, there are two capture latch elements for each data bit. For example, if the data in the data stream is divided into groups of ten bits, twenty capture latch elements L1–L20 are used to sample the ten data bits during a single VCO clock cycle. When in lock, every other capture latch will sample near the center of the data eye while the remaining capture latches will sample near the data transitions.

The phase and frequency at which each capture latch element samples the data stream is controlled by VCO 228, which has multiple stages for generating sample clock signals CK1–CK20. Each sample clock signal is delayed from the previous clock signal by an adjustable delay based on the voltage applied to voltage control input 226. These sample clock signals are passed through variable delay circuit 214 as discussed above with reference to FIG. 1.

Each sample clock generated by VCO 228 has a plurality of cycles, with each cycle having a positive phase and a negative phase. The frequency at which VCO 228 must oscillate can be reduced by a factor of two by organizing the capture latch elements into two groups which sample the data stream on opposite phases of the sample clocks. For example, if clocks CK11–CK20 correspond to the negative phase or edge of sample clocks CK1–CK10, respectively, then only ten sample clock signals are required to trigger capture latches L1–L20. Capture latch elements L1–L10 sample the data stream on the positive phase of sample clocks CK1–CK10 while capture latch elements L11–L20 sample the data stream on the negative phase of sample clocks CK1–CK10 (i.e. CK11–CK20).

Data phase detector 216 looks for the transitions in the input data stream and adjusts the phase and frequency of VCO 228 to match the phase and frequency of the transitions. For example, consider a case where a leading data capture latch captures a "1" and the subsequent (in time) data capture latch captures a "0". Data phase detector 216 uses the result at the output of the intermediate boundary capture latch (being clocked by a boundary capture latch clock of a phase intermediate of the leading data capture latch clock and the subsequent data capture latch clock) to determine if the boundary capture latch clock transition is leading or lagging the data transition. If the boundary capture latch captures a "1", the boundary capture latch clock transition is assumed to be leading the data transition since the subsequent data bit is a "0" and not a "1". If the boundary capture latch captures a "0", then the clock transition is assumed to be trailing the data transition. If any leading data capture latch, adjacent boundary capture latch and subsequent data capture latch all capture a "0" or a "1", no determination of relative phase can be made by the circuit, and no adjustment of phase or frequency is made.

Data phase detector 216 determines phase with an exclusive-OR tree formed by a plurality of exclusive-OR gates XOR1–XOR20 (XOR4–XOR19 not shown). The inputs of XOR1 are coupled to the non-inverted outputs of capture latches L1 and L2. The inputs of XOR2 are coupled to the non-inverted outputs of capture latches L2 and L3. The inputs of XOR3–XOR20 are coupled in a similar fashion.

Exclusive-OR gates XOR1–XOR20 are labeled DOWN and UP to indicate which exclusive-OR gates delay and slow down VCO 228 by increasing the delay between each sample clock signal and which exclusive-OR gates advance and speed up VCO 228 by decreasing the delay between each sample clock signal. The exclusive-OR gates that operate on output data from a data capture latch and the preceding (in time) boundary capture latch are referred to as DOWN exclusive-OR gates. The exclusive-OR gates that operate on a data capture latch and the trailing (in time) boundary capture latch are referred to as UP exclusive-OR gates.

A data transition between the sample time of boundary capture latch L1 and the sample time of data capture latch L2 generates a logic HIGH level (or "true" state) on the output of XOR1 indicating that VCO 228 should be delayed slightly since boundary capture latch L1 captured the data prior to the actual data transition. A transition between the sample time of data capture latch L2 and the sample time of boundary capture latch L3 generates a logic HIGH level on XOR2 indicating that VCO 228 should be advanced slightly, since boundary capture latch L1 latched after the actual data transition. Logic LOW levels (or "false" states) on the outputs of exclusive-OR gates XOR1–XOR20 induce no change in the phase or frequency of VCO 228.

The outputs of exclusive-OR gates XOR1–XOR20 form phase correction signals which are fed to voting circuit 404 through AND gates A1–A20. Voting circuit 404 compares the relative number of DOWN exclusive-OR gates having a logic HIGH output with the number of UP exclusive-OR gates having a logic HIGH output. If there are more "downs" than "ups", voting circuit 404 generates a logic HIGH level on phase control output 218A causing charge pump 220 to reduce the voltage across loop filter 224 slightly which causes VCO 228 to delay clock signals CK1–CK20. If there are more "ups" than "downs", voting circuit 404 generates a logic HIGH level on phase control output 218B causing charge pump 220 to increase the voltage across loop filter 224 slightly which causes VCO 228 to advance clock signals CK1–CK20.

If all UP and DOWN exclusive-OR gates are LOW or the number of "ups" and "downs" are equal, charge pump 220 makes no change to the voltage across filter 224. In one embodiment, voting circuit 120 is implemented with combinational logic. In an alternative embodiment, voting circuit 404 and charge pump 220 are replaced with ten charge pumps operating in parallel on filter 224.

Data valid circuit 410 prevents the phase correction signals from being applied to charge pump 220 until the data in capture latches L1–L20 are valid. The data valid circuit includes AND gates A1–A20 (A4–A19 not shown) and exclusive-OR gates XOR21–XOR40 (XOR24–XOR39 not shown). Exclusive-OR gates XOR21–XOR40 are coupled across the latch outputs of respective capture latches L1–L20, which are pre-charged to a common level in one embodiment. Data valid outputs DVD1–DVD20 of exclusive-OR gates XOR21–XOR40 indicate when the data in capture latches L1–L20 are valid (i.e. their true and complement outputs are not the same). AND gates A1–A20 are coupled between exclusive-OR gates XOR1–XOR20 and voting circuit 404 to gate the phase correction signals with data valid outputs DVD1–DVD20. The output of each exclusive-OR gate XOR1–XOR20 is gated with the data valid outputs that correspond to the inputs of that exclusive-OR gate. Once again, the particular phase-locked loop shown in FIG. 4 is provided as an example only.

In an alternative embodiment of the present invention, an offset voltage can be induced at the input of each of the capture latches L1–L20. FIG. 5 is a schematic diagram illustrating a single capture latch having offset control. The capture latch includes inputs A and AN, outputs Q and QN, clock input CLK and offset control inputs OFFSETP and OFFSETM. Inputs A and AN are coupled to the gates of differential transistors M3 and M4, respectively. The sources of transistors M3 and M4 are coupled to the drain of latch control transistor M5. The gate of transistor M5 is coupled to clock input CLK, and the source of transistor M5 is coupled to ground terminal GND.

Transistors M6–M9 form a pair of cross-coupled inverters 501 and 502 between capture latch outputs Q and QN. Transistors M6 and M8 form inverter 501, which has an input coupled to capture latch output Q and an output coupled to capture latch output QN. Transistors M7 and M9 form inverter 502, which has an input coupled to capture latch output QN and an output coupled to capture latch output Q. Pull-up transistor M10 is coupled between capture latch output QN and voltage supply terminal VDD, and pull-up transistor M11 is coupled between capture latch output Q and voltage supply terminal VDD. Offset control transistor M12 is coupled between capture latch output QN and voltage supply terminal VDD, and offset control transistor M13 is coupled between capture latch output Q and voltage supply terminal VDD. The gates of offset control transistors M12 and M13 are coupled to offset control inputs OFFSETM and OFFSETP, respectively.

During operation, when clock input CLK is inactive, pull-up transistors M10 and M11 pull capture latch outputs Q and QN toward the voltage on voltage supply terminal VDD. This resets the latch by balancing outputs Q and QN. When clock input CLK goes active, pull-up transistors M10 and M11 turn off, releasing outputs Q and QN, and latch control transistor MS turns on, providing current to differential transistor pair M3 and M4. Depending on whether the voltage at input A or AN is greater than the other, differential transistor pair M3 and M4 will steer current through cross-coupled inverters 501 and 502 so as to pull one of the capture latch outputs Q and QN low and the other of the capture latch outputs Q and QN high.

An input-referred offset voltage between outputs Q and QN can be induced by applying different voltages to offset control inputs OFFSETP and OFFSETM. If OFFSETP is greater than OFFSETM, an input-referred offset voltage induced on outputs Q and QN will be positive. If OFFSETP is less than OFFSETM, the input-referred offset voltage induced on outputs Q and QN will be negative.

In this embodiment, the offset control inputs OFFSETP and OFFSETM of capture latches L1–L20 (shown in FIG. 4) are controlled by optimization control circuit 208 (shown in FIG. 1). Optimization control circuit 208 can therefore induce a global offset voltage at the outputs of the slave capture latch array (210A or 210B) relative to the outputs of the master capture latch array (210A or 210B) by controlling the voltages applied to offset control inputs OFFSETP and OFFSETM of the slave capture latches, as opposed to inducing the offset voltage through equalizers 207A and 207B. This method of offset control can thus be used to scan the size of the data eye in the voltage domain in step 303 of the flowchart shown in FIG. 3 in alternative embodiments of the present invention. Other methods of inducing an offset voltage can also be used.

Although the present invention has been described with reference to preferred embodiments, workers skilled in the art will recognize that changes may be made in form and detail without departing from the spirit and scope of the invention. For example, a wide variety of clock recovery and de-serializer circuits can be used within the overall receiver apparatus discussed above. Also, a variety of test procedures and optimization sequences can be used to adaptively terminate a serial data stream according to the present invention. The procedures and sequences can be implemented in hardware or software, a finite state machine or a programmable computer, for example. Also, the receiver can be implemented with two separate phase-locked loops, one for each capture latch circuit in alternative embodiments. In addition, the term "coupled" used in the specification and the claims can include various types of connections or couplings and can include a direct connection or a connection through one or more intermediate components.

What is claimed is:

1. A method of adaptively terminating a received serial data signal, the method comprising:

(a) terminating the received serial data signal with a variable termination resistance;

(b) equalizing the received serial data signal with a first equalizer to produce a first equalized serial data signal;

(c) de-serializing the first equalized serial data signal;

(d) varying the termination resistance over a range of termination resistance values during steps (b) and (c);

(e) measuring a data eye size of the first equalized serial data signal for each of the termination resistance values in step (d); and (f) setting the termination resistance to one of the termination resistance values based on the data eye sizes measured in step (e).

2. The method of claim 1 wherein the data eye size is measured in step (e) in both a time domain and a voltage domain.

3. The method of claim 1 wherein:

step (c) comprises:
   (c) (1) sampling the first equalized serial data signal with a first capture latch circuit at a first set of sample times to produce a first recovered data signal; and
   (c) (2) sampling the first equalized serial data signal with a second capture latch circuit at a second set of sample times to produce a second recovered data signal; and step (e) comprises:
   (e) (1) delaying the first set of sample times by a variable delay relative to the second set of sample times;
   (e) (2) varying the variable delay over a range of delay values for each termination resistance value in step (d);
   (e) (3) detecting errors in the first recovered data signal for each of the delay values; and
   (e) (4) measuring the data eye size based on the errors detected in step (e) (3) for each of the termination resistance values.

4. The method of claim 3 wherein step (e) (3) comprises:
comparing the first and second recovered data signals to one another to obtain a bit error rate for the first recovered data signal for each of the delay values; and
storing the bit error rates for each of the delay values for each of the termination resistance values in a computer readable memory.

5. The method of claim 1 wherein step (b) further comprises equalizing the received serial data signal with a second equalizer to produce a second equalized serial data signal;

step (c) further comprises:
   (c) (1) sampling the first equalized serial data signal with a first capture latch circuit at a first set of sample times to produce a first recovered data signal; and
   (c) (2) sampling the second equalized serial data signal with a second capture latch circuit at a second set of sample times to produce a second recovered data signal; and step (e) comprises:
   (e) (1) delaying the first set of sample times by a variable delay relative to the second set of sample times;
   (e) (2) varying the variable delay over a range of delay values for each termination resistance value in step (d);
   (e) (3) detecting errors in the first recovered data signal for each of the delay values; and
   (e) (4) measuring the data eye size based on the errors detected in step (e) (3) for each of the termination resistance values.

6. The method of claim 1 wherein step (b) further comprises equalizing the received serial data signal with a second equalizer to produce a second equalized serial data signal; and step (e) comprises:
   (e) (1) varying a voltage offset of the first equalized serial data signal relative to a voltage offset of the second equalized serial data signal over a range of voltage offset values for each termination resistance in step (d);
   (e) (2) detecting errors in the first recovered data signal for each of the voltage offset values; and
   (e) (3) measuring the data eye size based on the errors detected in step (e) (2) for each of the termination resistance values.

7. The method of claim 6 wherein step (e) (2) comprises:
comparing the first and second recovered data signals to one another to obtain a bit error rate for the first recovered data signal for each of the voltage offset values; and
storing the bit error rates for each of the voltage offset values for each of the termination resistance values in a computer readable memory.

8. The method of claim 1 wherein step (c) comprises de-serializing the first equalized serial data signal with first and second capture latch arrays, respectively, and wherein step (e) comprises:
   (e) (1) varying a voltage offset of the first equalized serial data signal over a range of voltage offset values for each termination resistance value in step (d), wherein the voltage offset is induced by the first capture latch array;
   (e) (2) detecting errors in the first recovered data signal for each of the voltage offset values; and
   (e) (3) measuring the data eye size based on the errors detected in step (e) (2) for each of the termination resistance values.

9. A serial data communication receiver comprising:

a serial data input;

a termination resistance, which is coupled to the serial data input and is variable over a range of termination resistance values;

an equalizer circuit coupled to the serial data input and having an equalized serial data output;

first and second capture latch circuits coupled to the equalized serial data output, within a phase-locked loop, and having first and second recovered data outputs, respectively; and termination resistance control means for measuring a data eye size of the equalized serial data output based on the first and second recovered data outputs over the range of termination resistance values and for setting the termination resistance to one of the termination resistance values based on the measured data eye sizes.

10. The serial data communication receiver of claim 9 wherein:

the first and second capture latch circuits each comprise a sample clock input, which controls sampling of the equalized serial data output; and the termination resistance control means comprises:
   a variable delay, which is coupled in series with the sample clock input of the first capture latch circuit and is variable over a range of delay values;
   a comparator having first and second comparison inputs coupled to the first and second recovered data outputs, respectively, and having a comparison output; and a control circuit, which is adapted to vary the termination resistance over the range of resistance values and to vary the variable delay over the range of delay values for each termination resistance value while measuring a bit error rate from the comparison output for each of the delay values.

11. The serial data communication receiver of claim 9 wherein the equalizer circuit comprises first and second equalizers, which are coupled to the serial data input and have first and second equalized serial data outputs, respectively, and wherein the first and second equalized serial data outputs are coupled to the first and second capture latch circuits, respectively.

12. The serial data communication receiver of claim 11 wherein:
- the first equalizer applies a voltage offset to the first equalized serial data output, which is variable over a range of voltage offset values; and
- the termination resistance control means comprises:
  - a comparator having first and second comparison inputs coupled to the first and second recovered data outputs, respectively, and having a comparison output; and
  - a control circuit, which is adapted to vary the termination resistance over the range of resistance values and to vary the voltage offset over the range of voltage offset values for each termination resistance value while measuring a bit error rate from the comparison output for each of the voltage offset values.

13. A serial data communication receiver comprising:

a serial data input;

a termination resistance, which is coupled to the serial data input and is variable over a range of termination resistance values;

first and second equalizers coupled to the serial data input and having first and second equalized outputs, wherein the first equalizer applies a voltage offset to the first equalized output, which is variable based on a voltage offset control input;

first and second capture latch circuits coupled to the first and second equalized outputs, respectively, in a phase-locked loop and having first and second recovered data outputs, respectively, wherein the first capture latch circuit has a variable sample time relative to the second capture latch circuit based on a delay control input;

a comparator having first and second comparator inputs coupled to the first and second recovered data outputs, respectively, and having an error output; and a termination resistance control circuit coupled in a feedback loop between the error output and the termination resistance control input to control the voltage offset and delay control inputs and adjust the termination resistance based a resulting error on the error output.

* * * * *